United States Patent [19]

Mohr et al.

[11] Patent Number: 4,471,155
[45] Date of Patent: Sep. 11, 1984

[54] NARROW BAND GAP PHOTOVOLTAIC DEVICES WITH ENHANCED OPEN CIRCUIT VOLTAGE

[75] Inventors: Ralph Mohr; Vincent D. Cannella, both of Detroit, Mich.

[73] Assignee: Energy Conversion Devices, Inc., Troy, Mich.

[21] Appl. No.: 485,411

[22] Filed: Apr. 15, 1983

[51] Int. Cl.³ ............................................. H01L 31/06
[52] U.S. Cl. ..................... 136/258; 136/249; 136/255; 357/2; 357/30
[58] Field of Search ................. 136/249 TJ, 258 AM, 136/255; 357/2, 30

[56] References Cited

U.S. PATENT DOCUMENTS 4,379,943 4/1983 Yang et al. ................. 136/249 TJ

FOREIGN PATENT DOCUMENTS 56-88377 7/1981 Japan ......................... 136/258 AM

*Primary Examiner*—Aaron Weisstuch
*Attorney, Agent, or Firm*—Lawrence G. Norris

[57] ABSTRACT

The open circuit voltage and efficiency of photovoltaic devices formed from multiple regions of semiconductor alloys including at least one narrow band gap semiconductor alloy are enhanced. The device includes a pair of doped regions and an intrinsic body between the doped regions. The intrinsic body includes a first intrinsic region and an open circuit voltage enhancement means including a second intrinsic region. The second intrinsic region has a wider band gap than the band gap of the first intrinsic region and is disposed between the first intrinsic region and one of the doped regions. The open circuit enhancement means can also include a third intrinsic region also having a wider band gap than the first intrinsic region and disposed on the side of the first intrinsic region opposite the second intrinsic region.

30 Claims, 5 Drawing Figures

NARROW BAND GAP PHOTOVOLTAIC DEVICES WITH ENHANCED OPEN CIRCUIT VOLTAGE

FIELD OF THE INVENTION

This invention relates generally to photovoltaic devices and more particularly to photovoltaic devices of the type including at least one narrow band gap amorphous semiconductor alloy region. The devices provide enhanced open circuit voltage and the invention is most particularly adapted for use in amorphous semiconductor tandem photovoltaic devices.

BACKGROUND OF THE INVENTION

This invention relates to photovoltaic devices of the type formed from multiple amorphous semiconductor alloy regions deposited on a substrate. The invention more particularly relates to photovoltaic devices including at least one narrow band gap amorphous semiconductor alloy region and which provide enhanced open circuit voltage.

Recently, considerable efforts have been made to develop systems for depositing amorphous semiconductor alloys, each of which can encompass relatively large areas, and which can be doped to form p-type and n-type materials for the production of p-i-n and other type devices which are, in operation in photovoltaic and other applications, substantially equivalent to their crystalline counterparts.

It is now possible to prepare amorphous silicon alloys by glow discharge techniques that have acceptable concentrations of localized states in the energy gaps thereof, and provide high quality electronic properties. This technique is fully described in U.S. Pat. No. 4,226,898, Amorphous Semiconductors Equivalent To Crystalline Semiconductors, which issued in the names of Stanford R. Ovshinsky and Arun Madan on Oct. 7, 1980 and by vapor deposition as fully described in U.S. Pat. No. 4,217,374 which issued in the names of Stanford R. Ovshinsky and Masatsugu Izu, on Aug. 12, 1980, under the same title. As disclosed in these patents, fluorine introduced into the amorphous silicon semiconductor operates to substantially reduce the density of the localized defect states therein and facilitates the addition of other alloying materials, such as germanium.

Amorphous semiconductor materials are of great commercial importance because such materials enable mass production of photovoltaic devices. Unlike crystalline silicon which is limited to batch processing for the manufacture of solar cells, amorphous semiconductor alloys can be deposited in multiple layers over large area substrates to form solar cells in a high volume, continuous processing system. Continuous processing systems of this kind are disclosed, for example, in patents pending patent applications: Ser. No. 151,301, filed May 19, 1980 for A Method Of Making P-Doped Silicon Films And Devices Made Therefrom, now U.S. Pat. No. 4,400,409, issued Aug. 23, 1983; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System, now U.S. Pat. No. 4,410,558, issued Oct. 18, 1983; and Ser. No. 306,146, filed Sept. 28, 1981 for Multiple Chamber Deposition And Isolation System And Method, now U.S. Pat. No. 4,438,723, issued Mar. 27, 1984. As disclosed in these patents and applications, a substrate formed from stainless steel, for example, may be continuously advanced through a succession of deposition chambers, wherein each chamber is dedicated to the deposition of a specific material.

In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the diffusion of doping constituents into the intrinsic chamber. In the previously mentioned patents and patent applications, wherein the systems are primarily concerned with the production of photovoltaic cells, isolation between the chambers is accomplished by gas gates through which unidirectional gas flow is established and through which an inert gas may be "swept" about the web of substrate material.

The concept of utilizing multiple cells, to enhance photovoltaic device efficiency, was discussed at least as early as 1955 by E. D. Jackson in U.S. Pat. No. 2,949,498 issued Aug. 16, 1960. The multiple cell structures therein discussed utilized p-n junction crystalline semiconductor devices. Essentially, the concept is directed toward utilizing different band gap devices to more efficiently collect various portions of the solar spectrum and to increase open circuit voltage ($V_{oc}$). The tandem cell device has two or more cells with the light directed serially through each cell, with a large band gap material followed by one or more smaller band gap materials to absorb the light passed through the preceeding cell or layer.

The tandem photovoltaic devices formed from amorphous semiconductor alloys have also shown increased utilization of the solar spectrum for generating electrical energy as compared to single cell devices. Such a tandem device and a method of making the same is disclosed for example in U.S. patent application Ser. No. 359,825, filed Mar. 19, 1982 for Method And Apparatus For Continuously Producing Tandem Amorphous Photovoltaic Cells. The tandem device therein disclosed, and of the type to which the present invention is particularly directed, includes a plurality of amorphous semiconductor photovoltaic cells of the p-i-n configuration disposed in series relation on a substrate. Preferably, the intrinsic regions of the cells have different band gaps which are progressively narrower from the top cell (the cell upon which the incident radiation first impinges) to the bottom cell. As a result, each cell absorbs photons in different portions of the solar spectrum for creating charge carriers and generating electrical current from the collected carriers. Because the cells are coupled in series, it is necessary to match the photon generated current of the cells. This can be achieved by adjusting the band gaps and the thickness of the cell intrinsic regions as mentioned above.

In order to properly adjust the band gap of the cell intrinsic regions, it is necessary to narrow the band gap of at least one of the intrinsic regions. When the devices are formed from amorphous silicon alloys, this requires the incorporation of one or more band gap decreasing elements into the amorphous silicon. Germanium is one such band gap decreasing element.

Germanium can be incorporated into amorphous silicon alloys by, for example, the glow discharge decomposition of germane gas (GeH$_4$) together with a silicon containing gas such as silane (SiH$_4$). However, it has been observed that as the germanium concentration in the alloys is increased the electrical properties become increasingly inferior. The inferior electrical properties of these alloys is primarily due to an increased density of defect states in the band gaps of tese materials. This causes amorphous silicon-germanium alloys to have short carrier lifetimes, narrower collection widths and higher dark conductivities. The electrical properties diminish to the point that when the germanium concentration is above about fifty percent (50%, resulting in an adjusted band gap narrower than about 1.4 eV, the material is no longer suitable for photovoltaic applications. One effect of the increased density of defect states in amorphous silicon-germanium alloys is the reduction in open circuit voltage by an amount larger than can be reasonably explained by the reduction in band gap. This reduction in voltage is attributed to increased recombination at the increased defect states, and to interface states introduced by band gap and structural mismatch at the doped region-intrinsic region boundary.

Applicants herein have invented a new and improved device configuration which improves the performance of photovoltaic devices incorporating amorphous silicon-germanium alloys notwithstanding the foregoing. The new and improved devices incorporating the invention demonstrate enhanced open circuit voltage (Vo$_c$) over that previously obtainable with these narrow band gap alloys. The enhancement has been observed to be as much as 80 mV, representing an overall increase of about ten percent (10%) in device efficiency for a single cell device.

SUMMARY OF THE INVENTION

The open circuit voltage and efficiency of photovoltaic devices formed from multiple regions of semiconductor alloys including at least one narrow band gap semiconductor alloy are enhanced. The device includes a pair of doped semiconductor alloy regions and an intrinsic semiconductor alloy body between the doped regions. The intrinsic body includes a first intrinsic region and an open circuit voltage enhancement means including at least a second intrinsic region. The second intrinsic region has a wider band gap than the band gap of the first intrinsic region and is disposed between the first intrinsic region and one of the doped regions.

The first intrinsic region can have at least one band gap decreasing element therein and a higher density of states than the second intrinsic region. The band gap decreasing element can be germanium, tin, or lead.

The intrinsic regions are preferably formed from amorphous semiconductor alloys, for example, amorphous silicon alloys including hydrogen and/or fluorine. The second intrinsic region is preferably on the light entering side of the device.

The intrinsic body can also include a third intrinsic region disposed on the side of the first intrinsic region opposite the second intrinsic region. The third intrinsic region also has a wider band gap than the first intrinsic region.

DESCRIPTION OF THE PREFERRED EMBODIMENTS

Figure 1:
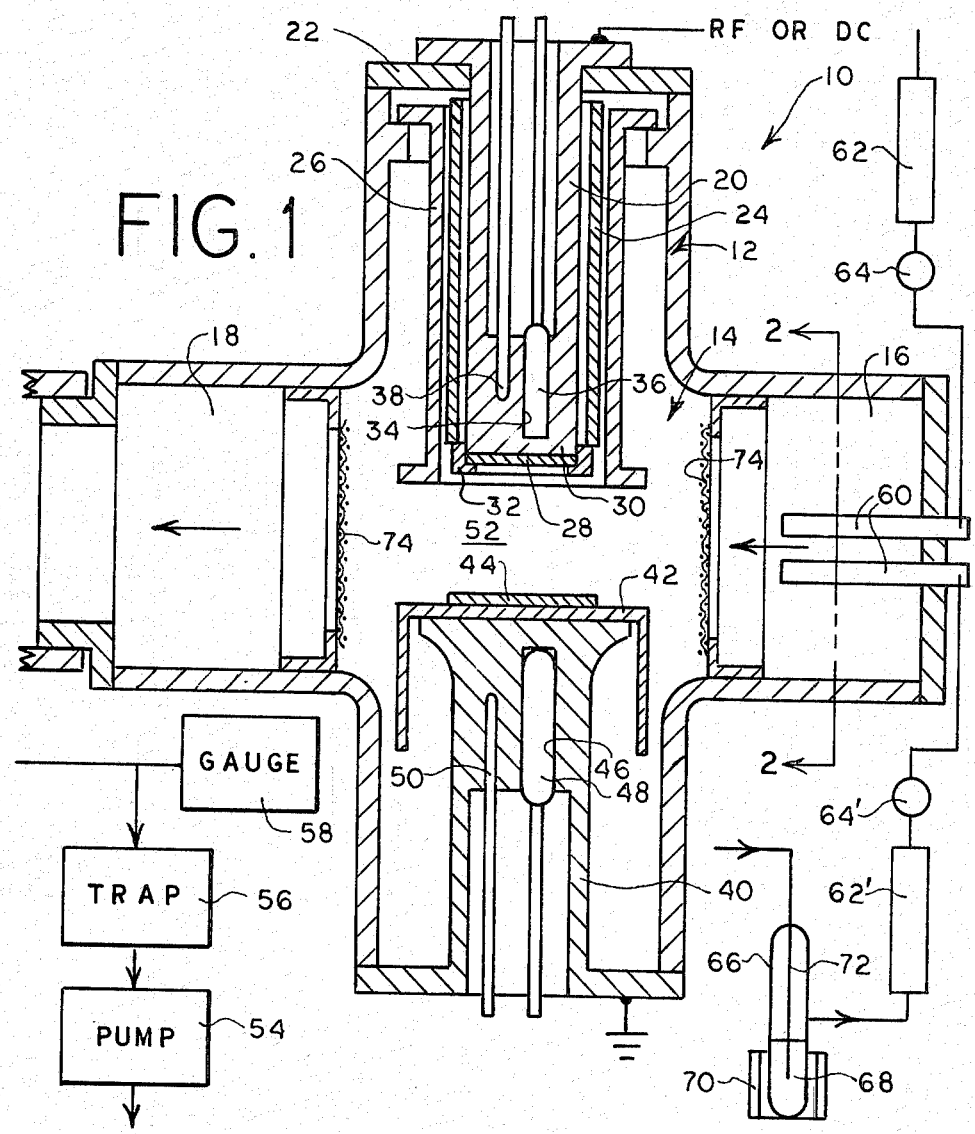
FIG. 1 is a diagrammatic representation of a glow discharge deposition system which may be utilized for making the photovoltaic devices of the invention.
Figure 2:
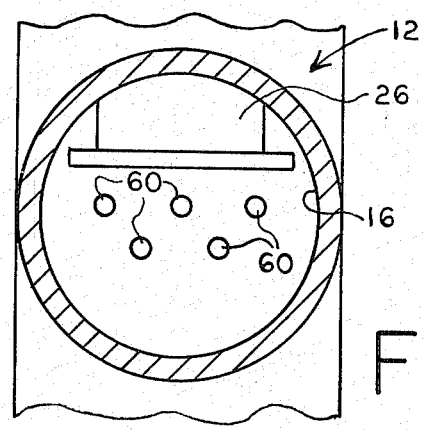
FIG. 2 is a sectional view of a portion of the system of FIG. 1 taken along lines 2—2 therein.

Referring now more particularly to FIG. 1, there is shown a glow discharge deposition system 10 including a housing 12. The housing 12 encloses a vacuum chamber 14 and includes an inlet chamber 16 and an outlet chamber 18. A cathode backing member 20 is mounted in the vacuum chamber 14 through an insulator 22.

The backing member 20 includes an insulating sleeve 24 circumferentially enclosing the backing member 20. A dark space shield 26 is spaced from and circumferentially surrounds the sleeve 24. A substrate 28 is secured to an inner end 30 of the backing member 20 by a holder 32. The holder 32 can be screwed or otherwise conventionally secured to the backing member 20 in electrical contact therewith.

The cathode backing member 20 includes a well 34 into which is inserted an electrical heater 36 for heating the backing member 20 and hence the substrate 28. The cathode backing member 20 also includes a temperature responsive probe 38 for measuring the temperature of the backing member 20. The temperature probe 38 is utilized to control the energization of the heater 36 to maintain the backing member 20 and the substrate 28 at any desired temperature.

The system 10 also includes an electrode 40 which extends from the housing 12 into the vacuum chamber 14 spaced from the cathode backing member 20. The electrode 40 includes a shield 42 surrounding the electrode 40 and which in turn carries a substrate 44 mounted thereon. The electrode 40 includes a well 46 into which is inserted an electrode heater 48. The electrode 40 also includes a temperature responsive probe 50 for measuring the temperature of the electrode 40 and hence the substrate 44. The probe 50 is utilized to control the energization of the heater 48 to maintain the electrode 40 and the substrate 44 at any desired temperature, independently of the member 20.

A glow discharge plasma is developed in a space 52 between the substrates 28 and 44 by the power generated from a regulated R.F., A.C. or D.C. power source coupled to the cathode backing member 20 across the space 52 to the electrode 40 which is coupled to ground. The vacuum chamber 14 is evacuated to the desired pressure by a vacuum pump 54 coupled to the chamber 14 through a particle trap 56. A pressure gauge 58 is coupled to the vacuum system and is utilized to control the pump 54 to maintain the system 10 at the desired pressure.

The inlet chamber 16 of the housing 12 preferably is provided with a plurality of conduits 60 for introducing materials into the system 10 to be mixed therein and to be deposited in the chamber 14 in the glow discharge plasma space 52 upon the substrates 28 and 44. If desired, the inlet chamber 16 can be located at a remote location and the gases can be premixed prior to being fed into the chamber 14. The gaseous materials are fed into conduits 60 through filters or other purifying devices 62 at a rate controlled by a valves 64.

When a material initially is not in a gaseous form, but instead is in a liquid or solid form, it can be placed into a sealed container 66 as indicated at 68. The material 68 then is heated by a heater 70 to increase the vapor pressure thereof in the container 66. A suitable gas, such as argon, is fed through a dip tube 72 into the material 68 so as to entrap the vapors of the material 68 and convey the vapors through filter 62' and valve 64' into the conduits 60 and hence into the system 10.

The inlet chamber 16 and the outlet chamber 18 preferably are provided with screen means 74 to confine the plasma in the chamber 14 and principally between the substrates 28 and 44.

The materials fed through the conduits 60 are mixed in the inlet chamber 16 and then fed into the glow discharge space 52 to maintain the plasma and deposit the alloy on the substrates with the incorporation of silicon, fluorine, and other desired elements, such as hydrogen, and/or dopants or other desired materials.

In operation, and for depositing layers of intrinsic amorphous silicon alloys, the system 10 is first pumped down to a desired deposition pressure, such as less than 20 mtorr, prior to deposition. The starting materials or reaction gases such as silane gas ($SiH_4$) for example or silicon tetrafluoride ($SiF_4$) and molecular hydrogen ($H_2$) and/or silane are fed into the inlet chamber 16 through separate conduits 60 and are then mixed in the inlet chamber. The gas mixture is fed into the vacuum chamber 14 to maintain a partial pressure therein of about one torr. A plasma is generated in the space 52 between the substrates 28 and 44 using either a DC voltage of greater than 1000 volts or by radio frequency power of about 50 watts operating at a frequency of 13.56 MHz or other desired frequency.

For making an intrinsic narrow band gap amorphous silicon-germanium alloy, germane gas ($GeH_4$) can be fed into the inlet chamber 16 along with the other starting intrinsic reaction gases. Gas mixtures for this purpose can be: ten parts silane, one part germane, and eighty-nine parts hydrogen; or one part silicon tetrafluoride, one part silane, one part germane, and five parts hydrogen.

In addition to the intrinsic amorphous silicon alloys deposited in the manner as described above, the devices of the present invention as illustrated in the various embodiments to be described hereinafter also utilize doped amorphous silicon alloys. These doped alloy layers are p or n type in conductivity and can be formed by introducing an appropriate dopant into the vacuum chamber along with the intrinsic starting materials such as silane ($SiH_4$) or silicon tetrafluoride ($SiF_4$) and/or hydrogen and/or silane.

For n or p doped layers, the material can be doped with 5 to 100 ppm of dopant material as it is deposited. The n dopants can be phosphorus, arsenic, antimony, or bismuth. Preferably, the n doped layers are deposited by the glow discharge decomposition of at least silicon tetrafluoride ($SiF_4$) and phosphine ($PH_3$). Hydrogen and/or silane gas ($SiH_4$) may also be added to this mixture.

The p dopants can be boron, aluminum, gallium, indium, or thallium. Preferably, the p doped layers are deposited by the glow discharge decomposition of at least silane and diborane ($B_2H_6$) or silicon tetrafluoride and diborane. To the silicon tetrafluoride and diborane, hydrogen and/or silane can also be added.

The doped layers of the devices are deposited at various temperatures in the range of 200° C. to about 1000° C., depending upon the form of the material used and the type of substrate used. For aluminum substrates, the upper temperature should not be above about 600° C. and for stainless steel it could be above about 1000° C. For the intrinsic and doped alloys initially deposited from silane gas, the substrate temperature should be less than about 400° C. and preferably about 225° C.

Figure 3:
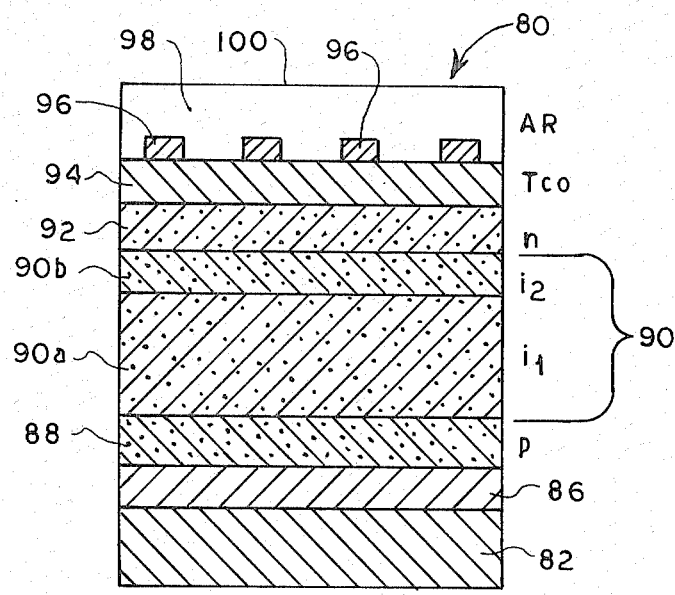
FIG. 3 is a sectional view of a p-i-n photovoltaic device structured in accordance with a first embodiment of the present invention.

Referring now to FIG. 3, it illustrates in sectional view a p-i-n device structured in accordance with a first embodiment of the present invention. The device 80 includes a substrate 82 which may be, for example, a flexible web formed from stainless steel or aluminum. The substrate 82 is of a width and length as desired and preferably 3 mils thick.

An electrode 86 is deposited in one or more layers upon the substrate 82 to form a base electrode for the cell 80. The electrode 86 layer or layers are deposited by vapor deposition, which is a relatively fast deposition process. The electrode layers preferably are formed from a reflective metal of for example, silver, molybdenum, aluminum, chrome, or copper. A reflective electrode is preferrable since, in a solar cell, nonabsorbed light which passes through the device is reflected from the electrode layer 86 where it again passes through the device which then absorbs more of the light energy to increase the device efficiency.

The substrate 82 is then placed in the glow discharge deposition environment. A first doped amorphous silicon alloy layer 88 is deposited on the substrate. The layer 88 as shown comprises a p-type region. The p region 88 is on the order of 50 to 200Å in thickness and serves to establish a potential gradient across the device to facilitate the collection of photo induced electron-hole pairs as electrical current. The p region 88 can be deposited from any of the gas mixtures previously referred to for the deposition of such material.

A body of intrinsic amorphous silicon alloy 90 is next deposited over the first doped layer 88. The intrinsic body 90 comprises a first intrinsic region 90a adjacent the first doped layer 88 and a second intrinsic region 90b on the light entering side of the first intrinsic region 90a. The first intrinsic region 90a is relatively thick, on the order of 2500Å, has a narrowed band gap, and is deposited from a starting material such as silane ($SiH_4$) gas, germane ($GeH_4$) gas, and hydrogen as previously described. The second intrinsic region 90b is relatively thin, on the order of 200Å, has a band gap greater than the band gap of the first intrinsic region 90a, and is deposited for example from silicon tetrafluoride and hydrogen and/or silane. As a result, the first intrinsic region 90a incorporates a band gap decreasing element, for example, germanium, while the second intrinsic region does not incorporate a band gap decreasing element.

Deposited on the intrinsic body 90 adjacent the second intrinsic region 90b is a further doped layer 92 which is of opposite conductivity with respect to the first doped layer 88. It comprises an n-type conductivity region. The n region is deposited from any of the gas mixtures previously referred to for the deposition of such material. The n region 92 is deposited to a thickness between 50 and 200Å.

A transparent conductive oxide (TCO) layer 94 is then deposited over the further doped layer 92. The TCO layer 94 can be deposited in a vapor deposition environment and, for example, may be indium tin oxide (ITO), cadmium stannate ($Cd_2SnO_4$), or doped tin oxide ($SnO_2$).

On the surface of the TCO layer 94 is deposited a grid electrode 96 made of a metal having good electrical conductivity. The grid may comprise orthogonally related lines of conductive material occupying only a minor portion of the area of the device, the rest of which is to be exposed to solar energy. For example, the grid 96 may occupy only about from 5 to 10% of the entire area of the device 80. The grid electrode 96 uniformly collects current from the TCO layer 94 to assure a good low series resistance for the device.

To complete the device 80, an anti-reflection (AR) layer 98 is applied over the grid electrode 96 and the areas of the TCO layer 94 between the grid electrode areas. The AR layer 98 has a solar radiation incident surface 100 upon which the solar radiation impinges while entering the device 80. For example, the AR layer 98 may have a thickness on the order of magnitude of the wavelength of the maximum energy point of the solar radiation spectrum, divided by four times the index of refraction of the anti-reflection layer 98. A suitable AR layer 98 would be zirconium oxide of about 500Å in thickness with an index of refraction of 2.1.

The open circuit voltage ($V_{oc}$) of the device 80 is enhanced by as much as 80 millivolts by virtue of the second intrinsic region 90b. This voltage enhancement can be attributed to the fact that the first intrinsic region 90a has a higher density of states than the second intrinsic region 90b because of the incorporation of the band gap decreasing element in the first intrinsic region. Therefore, the second intrinsic region 90b provides a smoother transition from the first intrinsic region 90a, which is the main intrinsic region where the majority of the photons are absorbed to create electron-hole pairs, to the doped region 92. This transition results in fewer interface states which serve as recombination centers. The transition also provides less structural mismatch because the structure of the second intrinsic region 90b more closely resembles the structure of the doped region 92 than does the structure of the first intrinsic region 90a which incorporates the band gap decreasing element.

In addition to the foregoing, it is noted that the band gap of the doped region 92 is wider than the band gap of the first intrinsic region 90a. Because the band gap of the second intrinsic region 90b is intermediate between the band gaps of the first intrinsic region 90a and the doped region 92, the second intrinsic region 90b also decreases the band gap mismatch between the first intrinsic region 90a and the doped region 92.

All of the above factors are believed to contribute to the observed enhancement in open circuit voltage. As previously mentioned, this enhancement has been observed to be as much as 80 millivolts. This represents about a ten precent increase in open circuit voltage and efficiency by virtue of the open circuit voltage enhancement region 90b.

Figure 4:
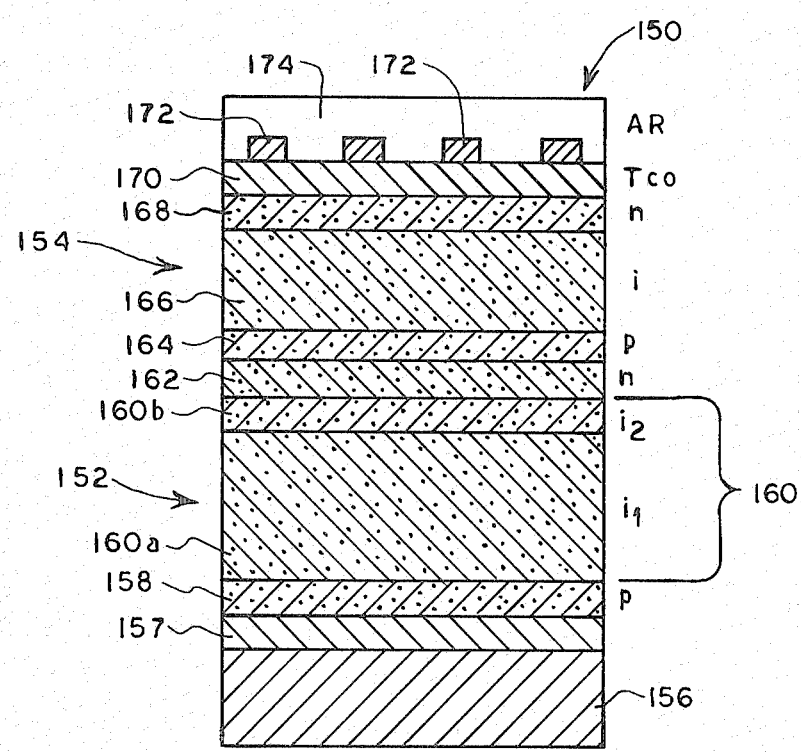
FIG. 4 is a sectional view of a multiple solar cell incorporating a plurality of p-i-n photovoltaic cell units arranged in tandem configuration in accordance with the present invention.

While a single cell embodiment is illustrated in FIG. 3 to illustrate the principle and the broader aspects of the present invention, the present invention can be practiced to greatest advantage in a tandem photovoltaic device configuration wherein a main narrow band gap intrinsic region is most desired as previously mentioned. FIG. 4 shows such a tandem device 150 embodying the present invention. The device 150 comprises two single cell units 152 and 154 arranged in series relation. The cell unit 152 comprises a narrow band gap cell and the cell unit 154 comprises a wider band gap cell. As can be appreciated, plural single cell units of more than two can be utilized.

The device 150 includes a substrate 156 formed from a metal having good electrical conductivity such as stainless steel or aluminum, for example. Deposited over the substrate 156 is a back surface reflector 157 like the reflector layer 86 of FIG. 3. The first cell unit 152 includes a p-type amorphous silicon alloy region 158 deposited on the back reflector layer 157. The p-type region 158 can be deposited from any of the previously mentined starting materials for depositing such material.

Deposited on the p-type region 158 is an intrinsic amorphous semiconductor alloy body 160. The intrinsic alloy body 160, in accordance with the present invention, includes a first intrinsic region 160a and an open circuit voltage enhancement second intrinsic region 160b. The first intrinsic region 160a is slightly p-type, has a narrow band gap and is deposited from a starting material such as silane, germane and hydrogen as previously described. The second intrinsic region 160b has a wider band gap than the first intrinsic region 160a and is deposited from starting materials not including a band gap decreasing element. For example, the second intrinsic region 160b can be an amorphous siliconhydrogen or amorphous silicon-hydrogen-fluorine alloy deposited in a manner as previously described. The thickness of the second intrinsic region 160b is about 200Å and the thickness of the first intrinsic region 160a is about 2500Å.

Deposited on the second intrinsic region 160b is a further doped amorphous silicon alloy layer 162. It is opposite in conductivity with respect to the conductivity of the first doped region 158 and thus is an n-type region. It is to be noted that since the first intrinsic region 160a is slightly p-type, the open circuit voltage enhancement second intrinsic region 160b within the high field region of unit cell 152.

The second unit cell 154 includes a first doped p-type region 164, an intrinsic region 166 and a further doped n-type region 168. The device 150 is completed with a TCO layer 170, a grid electrode 172, and an anti-reflection layer 174.

The band gap of the intrinsic region 166 is preferably greater than the band gap of region 160a. To that end, the alloy forming region 166 can have a non-adjusted band gap or include one or more band gap increasing elements such as nitrogen or carbon. It can be noted from the figure that the intrinsic region 160a is thicker than the intrinsic region 166. This, together with the narrow band gap of region 160a and the wider band gap of region 166 allows the entire usable spectrum of the solar energy to be utilized for generating electron-hole pairs.

Although a tandem cell embodiment has been shown and described herein, the unit cells can also be isolated from one another with oxide layers for example, to form a stacked multiple cell. Each cell could include a pair of collection electrodes to facilitate the series connection of the cells with external wiring.

Figure 5:
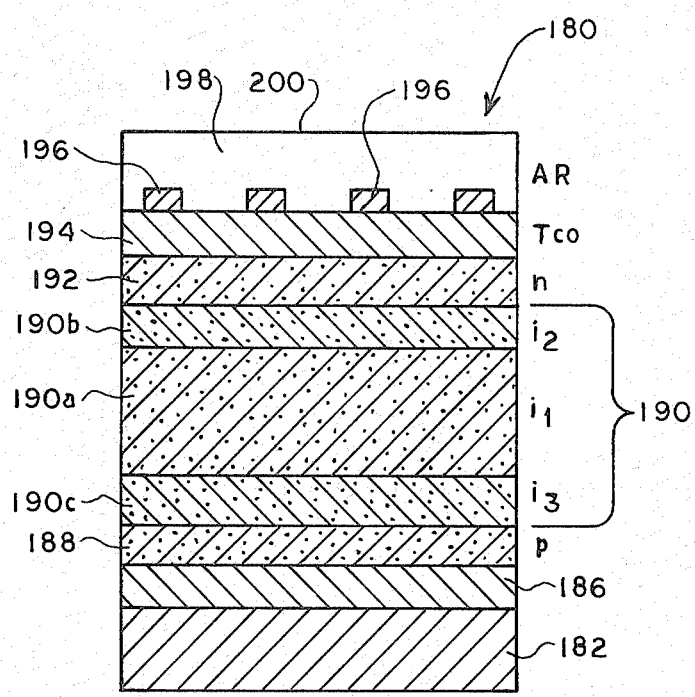
FIG. 5 is a sectional view of a p-i-n photovoltaic device structured in accordance with another embodiment of the present invention.

Referring now to FIG. 5, it illustrates in sectional view another p-i-n device structured in accordance with the present invention. The device 180 includes a substrate 182 which may again be, for example, a flexible web formed from stainless steel or aluminum having a width and length as desired and preferably 3 mils thick.

An electrode 186 is deposited in one or more layers upon the substrate 182 to form a reflective electrode as previously described to reflect nonabsorbed light back through the device. A first doped amorphous silicon alloy layer 188 is deposited on the substrate. The layer 188 as shown comprises a p-type region. The p region 188 is on the order of 50 to 200Å thick to establish a potential gradient across the device to facilitate the collection of photo induced electron-hole pairs as electrical current. The p region 188 can be deposited from any of the gas mixtures previously referred to for the deposition of such material. The p region 188 can also have a widened band gap by incorporating a band gap increasing element such as carbon or nitorgen into the material. This can be accomplished by introducing methane gas ($CH_4$) or ammonia gas ($NH_3$) into the deposition gas mixtures previously mentioned for depositing p-type material.

A body of intrinsic amorphous silicon alloy 190 is next deposited over the first doped layer 188. The intrinsic body 190 comprises a first intrinsic region 190a, a second intrinsic region 190b, and a third intrinsic region 190c. The second intrinsic region 190b is on the light entering side of the first intrinsic region 190a. The third intrinsic region 190c is on the opposite side of the first intrinsic region 190a. The first intrinsic region 190a is relatively thick, on the order of 2500Å, has a narrowed band gap, and is deposited from a starting material such as silane ($SiH_4$) gas, germane ($GeH_4$) gas, and hydrogen as previously described. The second and third intrinsic regions 190b and 190c are relatively thin, on the order of 200Å, have a band gap greater than the band gap of the first intrinsic region 190a, and are deposited for example from silicon tetrafluoride and hydrogen and/or silane. As a result, the first intrinsic region 190a incorporates a band gap decreasing element, for example, germanium, while the second and third intrinsic regions do not incorporate a band gap decreasing element.

Deposited on the intrinsic body 190 adjacent the second intrinsic region 190b is a further doped layer 192 which is of opposite conductivity with respect to the first doped layer 188. It comprises an n-type conductivity region. The n region is deposited from any of the gas mixtures previously referred to for the deposition of such material. The n region 192 is deposited to a thickness between 50 and 200Å.

A transparent conductive oxide (TCO) layer 194 is then deposited over the further doped layer 192. The TCO layer 194 can be deposited in a vapor deposition environment and, for example, may be indium tin oxide (ITO), cadmium stannate ($Cd_2SnO_4$), or doped tin oxide ($SnO_2$).

On the surface of the TCO layer 194 is deposited a grid electrode 196 made of a metal having good electrical conductivity. The grid may comprise orthogonally related lines of conductive material occupying only a minor portion of the area of the device, the rest of which is to be exposed to solar energy. For example, the grid 196 may occupy only about from 5 to 10% of the entire area of the device 80. The grid electrode 196 uniformly collects current from the TCO layer 194 to assure a good low series resistance for the device.

To complete the device 180, an anti-reflection (AR) layer 198 is applied over the grid electrode 196 and the areas of the TCO layer 194 between the grid electrode areas. The AR layer 198 has a solar radiation incident surface 200 upon which the solar radiation impinges while entering the device 180. As previously described, the AR layer 198 may have a thickness on the order of magnitude of the wavelength of the maximum energy point of the solar radiation spectrum, divided by four times the index of refraction of the anti-reflection layer 198. A suitable AR layer 198 would be zirconium oxide of about 500Å in thickness with an index of refraction of 2.1.

The open circuit voltage ($V_{oc}$) of the device 180 is also enhanced. In addition to the factors previously mentioned for enhancing the open circuit voltage of device 80 of FIG. 3, the third intrinsic region 190c provides further enhancement because the band gap of the third intrinsic region 190c is also intermediate between the band gaps of the first intrinsic region 190a and the doped, wide band gap region 188. As a result, the third intrinsic region 190c also decreases the band gap mismatch between the first intrinsic region 190a and the doped region 188.

For each embodiment of the invention described herein, the alloy layers other than the intrinsic alloy layers can be other than amorphous layers, such as polycrystalline layers. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the scope of the appended claims the invention may be practiced otherwise than as specifically described.

What is claimed and described to be secured by letters patent of the United States is:

1. A photovoltaic device formed from multiple regions of semiconductor alloys deposited on a substrate, wherein each of said semiconductor alloys has a band gap, said device providing enhanced open circuit voltage in response to light incident thereon and comprising:

a pair of oppositely doped semiconductor alloy regions and an intrinsic simiconductor alloy body between said oppositely doped semiconductor alloy regions, said intrinsic body including a first intrinsic region and an open circuit voltage enhancement means including at least a second intrinsic region having a wider band gap than the band gap of said first intrinsic region for enhancing the open circuit voltage of said device, said second intrinsic region being disposed immediately adjacent said first intrinsic region on the side thereof opposite the side thereof on which said incident light impinges.

2. A photovoltaic device as defined in claim 1 wherein said first intrinsic region is formed from an amorphous semiconductor alloy.

3. A photovoltaic device as defined in claim 2 wherein said amorphous semiconductor alloy is an amorphous silicon alloy.

4. A photovoltaic device as defined in claim 3 wherein said amorphous silicon alloy includes at least one band gap decreasing element.

5. A photovoltaic device as defined in claim 4 wherein said band gap decreasing element is one of the group consisting of germanium, tin and lead.

6. A photovoltaic device as defined in claim 5 wherein said amorphous silicon alloy further includes hydrogen.

7. A photovoltaic device as defined in claim 5 wherein said amorphous silicon alloy further includes fluorine.

8. A photovoltaic device as defined in claim 1 wherein said second intrinsic region is formed from an amorphous semiconductor alloy.

9. A photovoltaic device as defined in claim 8 wherein said amorphous semiconductor alloy is an amorphous silicon alloy.

10. A photovoltaic device as defined in claim 9 wherein said amorphous silicon alloy includes hydrogen.

11. A photovoltaic device as defined in claim 9 wherein said amorphous silicon alloy includes fluorine.

12. A photovoltaic device as defined in claim 1 wherein said oppositely doped regions comprise a p-type region and an n-type region, and wherein said second intrinsic region is between said first intrinsic region and said p-type region.

13. A photovoltaic device as defined in claim 1 wherein said enhancement means includes a third intrinsic region disposed directly adjacent said first intrinsic region on the light incident side thereof.

14. A photovoltaic device as defined in claim 13 wherein said third intrinsic region has a band gap which is wider than the band gap of said first intrinsic region.

15. A photovoltaic device as defined in claim 14 wherein one of said oppositely doped regions comprises a wide band gap p-type region.

16. A photovoltaic device formed from multiple regions of amorphous semiconductor alloys deposited on a substrate, wherein each of said regions has a band gap, said device providing enhanced open circuit voltage in response to light incident thereon and comprising:
a pair of oppositely doped amorphous semiconductor alloy regions and an intrinsic amorphous semiconductor alloy body between said oppositely doped regions, said intrinsic body including a first intrinsic region including at least one band gap descreasing element and open circuit enhancement means including at least a second intrinsic region not including a band gap decreasing element, said second intrinsic region being immediately adjacent said first intrinsic region on the side thereof opposite the side therefrom on which said incident light impinges.

17. A photovoltaic device as defined in claim 16 wherein said at least one band gap decreasing element is germanium.

18. A photovoltaic device as defined in claim 16 wherein said second intrinsic region consists essentially of silicon and hydrogen.

19. A photovoltaic device as defined in claim 16 wherein said second intrinsic region consists essentially of silicon, hydrogen, and fluorine.

20. A photovoltaic device as defined in claim 16 wherein said second intrinsic region consists essentially of silicon and fluorine.

21. A photovoltaic device as defined in claim 16 wherein said oppositely doped regions comprise a p-type region and an n-type region, and wherein said second intrinsic region is between said p-type region and said first intrinsic region.

22. A photovoltaic device as defined in claim 16 wherein said enhancement means includes a third intrinsic region not including a band gap decreasing element and being disposed directly adjacent said first intrinsic region on the light incident side thereof.

23. A photovoltaic device as defined in claim 22 wherein one of said oppositely doped regions comprises a wide band gap p-type region.

24. A photovoltaic device formed form multiple regions of amorphous semiconductor materials deposited on a substrate, wherein each of said materials has a certain density of defect states in the band gaps thereof, said device providing enhanced open circuit voltage in response to light incident thereon and comprising:
a pair of oppositely doped regions and an intrinsic body between said oppositely doped regions, said intrinsic body including a first region and a second region, said first region having a higher density of states than said second region, and said second region being disposed immediately adjacent said first region on the side thereof opposite the side thereof on which said incident light impinges.

25. A photovoltaic device as defined in claim 24 wherein said first intrinsic region includes a band gap decreasing element.

26. A photovoltaic device as defined in claim 25 wherein said band gap decreasing element is one of the group consisting of germanium, tin and lead.

27. A photovoltaic device as defined in claim 24 wherein said first intrinsic region is an amorphous silicon alloy including at least germanium.

28. A photovoltaic device as defined in claim 24 wherein said oppositely doped regions comprise a p-type region and an n-type region, and wherein said second intrinsic region is between said p-type region and said first intrinsic region.

29. A photovoltaic device as defined in claim 24 wherein said intrinsic body includes a third region, said first region having a higher density of said states than said third region, and said third region being disposed directly adjacent said first region on the light incident side thereof.

30. A photovoltaic device as defined in claim 29 wherein one of said oppositely doped regions comprises a wide band gap p-type region.

* * * * *